United States Patent
Vasanth et al.

[11] Patent Number: 6,157,062
[45] Date of Patent: *Dec. 5, 2000

[54] INTEGRATING DUAL SUPPLY VOLTAGE BY REMOVING THE DRAIN EXTENDER IMPLANT FROM THE HIGH VOLTAGE DEVICE

[75] Inventors: Karthik Vasanth, Richardson; Richard G. Burch, McKinney; Sharad Saxena, Richardson; Purnendu K. Mozumder, Plano; Chenjing L. Fernando, Dallas; Joseph C. Davis, Allen; Suraj Rao, Dallas, all of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/287,227

[22] Filed: Apr. 6, 1999

Related U.S. Application Data

[60] Provisional application No. 60/081,510, Apr. 13, 1998.

[51] Int. Cl.[7] .................................................. H01L 29/76
[52] U.S. Cl. ........................... 257/336; 257/408; 257/344; 257/369; 257/204; 257/346; 257/382; 257/387; 438/275; 438/299; 438/301; 438/302; 438/286
[58] Field of Search ...................................... 257/336, 408, 257/369, 204, 382, 344, 346, 371, 387; 438/275, 299, 301, 302, 286

[56] References Cited

U.S. PATENT DOCUMENTS

| 5,338,960 | 8/1994 | Beasom | 257/408 |
|---|---|---|---|
| 5,512,771 | 4/1996 | Hiroki et al. | 257/369 |
| 5,576,226 | 11/1996 | Hwang | 438/275 |
| 5,608,240 | 3/1997 | Kumagai | 257/408 |
| 5,656,861 | 8/1997 | Godinho et al. | 257/382 |
| 5,900,666 | 5/1999 | Gardner et al. | 257/900 X |

*Primary Examiner*—Matthew Smith
*Assistant Examiner*—Belur Keshavan
*Attorney, Agent, or Firm*—Jacqueline J. Garner; Wade James Brady, III; Frederick J. Telecky, Jr.

[57] ABSTRACT

A dual voltage chip is fabricated with no intermediate-doped (LDD or MDD) area in the high-voltage transistors by adjusting the gate sidewall spacer thickness and the source/drain implant.

14 Claims, 1 Drawing Sheet

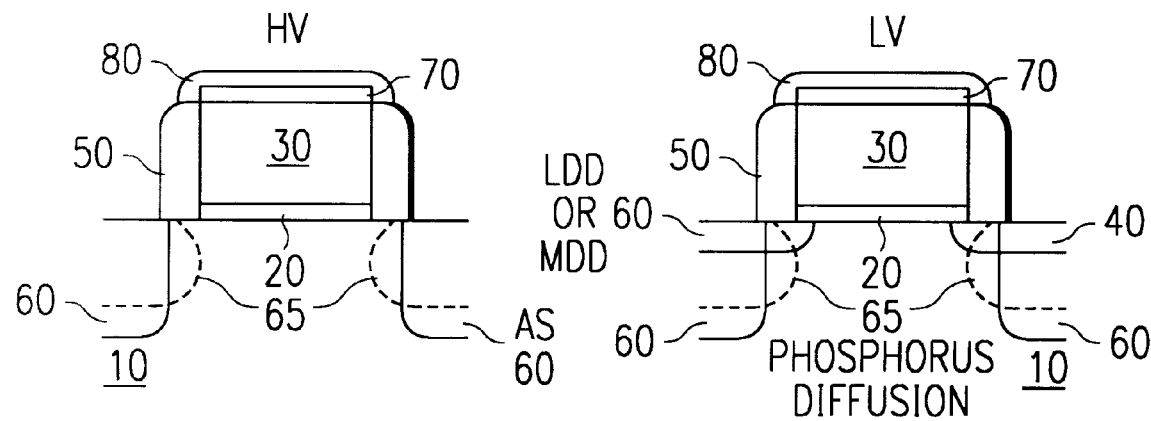

```
┌─────────────────────────────────────────────┐
│ FORM ISOLATION STRUCTURES.                  │
│                                  (STEP 100) │
└─────────────────────────────────────────────┘
                      ↓
┌─────────────────────────────────────────────┐
│ MASK PMOS TRANSISTORS; PERFORM CHANNEL      │
│ IMPLANTS FOR ALL PMOS TRANSISTORS.          │
│                                  (STEP 110) │
└─────────────────────────────────────────────┘
                      ↓
┌─────────────────────────────────────────────┐
│ MASK NMOS TRANSISTORS; PERFORM CHANNEL      │
│ IMPLANTS FOR ALL PMOS TRANSISTORS.          │
│                                  (STEP 120) │
└─────────────────────────────────────────────┘
                      ↓
┌─────────────────────────────────────────────┐
│ FORM GATE STRUCTURES.                       │
│                                  (STEP 130) │
└─────────────────────────────────────────────┘
                      ↓
┌─────────────────────────────────────────────┐
│ MASK PMOS AND HV-NMOS TRANSISTORS; PERFORM  │
│ DRAIN EXTENDER IMPLANTS FOR LV-NMOS         │
│ TRANSISTORS.                     (STEP 140) │
└─────────────────────────────────────────────┘
                      ↓
┌─────────────────────────────────────────────┐
│ MASK NMOS TRANSISTORS; PERFORM DRAIN        │
│ EXTENDER IMPLANTS FOR PMOS TRANSISTORS.     │
│                                  (STEP 150) │
└─────────────────────────────────────────────┘
                      ↓
┌─────────────────────────────────────────────┐
│ FORM SIDEWALL SPACERS.                      │
│                                  (STEP 160) │
└─────────────────────────────────────────────┘
                      ↓
┌─────────────────────────────────────────────┐
│ MASK PMOS TRANSISTORS; PERFORM SOURCE/DRAIN │
│ IMPLANTS FOR NMOS TRANSISTORS.              │
│                                  (STEP 170) │
└─────────────────────────────────────────────┘
                      ↓
┌─────────────────────────────────────────────┐
│ MASK NMOS TRANSISTORS; PERFORM SOURCE/DRAIN │
│ IMPLANTS FOR PMOS TRANSISTORS.              │
│                                  (STEP 180) │
└─────────────────────────────────────────────┘
                      ↓
┌─────────────────────────────────────────────┐
│ FORM SILICIDE CONTACTS.                     │
│                                  (STEP 190) │
└─────────────────────────────────────────────┘
```

*FIG. 1*

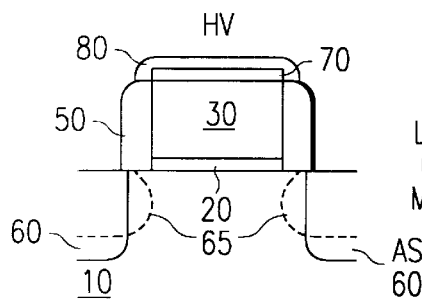
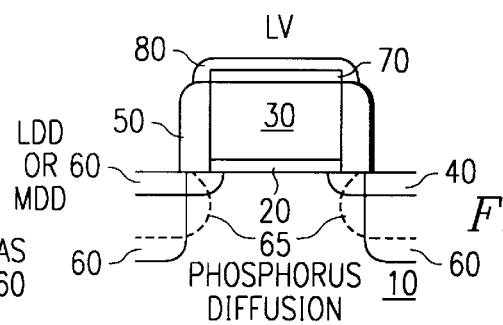

*FIG. 2*

INTEGRATING DUAL SUPPLY VOLTAGE BY REMOVING THE DRAIN EXTENDER IMPLANT FROM THE HIGH VOLTAGE DEVICE

This application claims priority under 35 USC § 119 (e)(1) of provisional application No. 60/081,510, filed Apr. 13, 1998.

BACKGROUND AND SUMMARY OF THE INVENTION

The present application concerns integrated circuits, especially the structures and processes necessary to integrate dual supply voltages onto a single chip.

Drain Profile Engineering

One of the long-standing problems in submicron field effect transistors is hot carrier effects. In an old-fashioned NMOS single-drain-diffusion transistor structure, the potential energy (voltage) of an electron changes dramatically as it crosses the boundary of the N+ drain diffusion. This sharp change in potential energy, over a short distance, defines a high electric field value, which is undesirable because it causes the electrons (and to a much lesser extent, holes) to behave in a different way within the semiconductor lattice. Electrons which have been activated in this way by high electric fields are referred to as "hot electrons." Such electrons can, for example, penetrate into or through the gate dielectric, and can cause the gate dielectrics to become charged up over time, until the transistor fails in service.

One technique to avoid hot carrier effects is lightly doped drain extension regions, or "LDD" regions. In this structure, a first light and shallow implant is performed before sidewall spacers are formed on the gate structure, with a second heavier implant afterwards to form the source/drain. The first implant provides only a relatively low conductivity in the silicon, but prevents the channel-drain voltage difference from appearing entirely at the drain boundary. By increasing the distance over which this voltage difference occurs, the peak electric field is reduced, and this tends to reduce channel hot carrier ("CHC") effects.

The trade-off as lighter-doped regions are introduced into the process is that transistor performance decreases due to the increased resistance, so the chip designer seeks to find a balance between these two opposing demands. In more recent years, with device sizes shrinking and voltages dropping, the doses needed for LDD regions have become closer to those used for the main source/drain implant, so that these implants are now referred to as "MDD" (medium-doped drain) regions.

Dual-Voltage Chip Architectures

As integrated circuit geometries have shrunk below one micron, the possibility of using two supply voltages has appeared increasingly attractive. In this process option, the central part of a chip (the "core", which performs the actual electrical functionality which is desired from the chip) can be fully optimized for the current state of process engineering for packing density and highest performance, without regard to the voltage standards required for interfacing to the external world. Since many different chips must communicate, the voltage standard required for external interface tend to change relatively slowly. As of 1997, there was no standard signal level below 3.3 volts which is in really widespread usage, whereas the internal voltages of chips in production or announced are very commonly 2.5 volts, 2 volts, or below.

Thus, process optimization for a dual-voltage chip presents some important problems. First, the use of two different voltages demands that different gate oxide thicknesses be used for the core and peripheral transistors. Second, the basic process design should be determined, as far as possible, by optimization of the core devices, since this is the large majority of the area of the chip; the question is then how to modify the basic optimized process to achieve adequate reliability and performance in the peripheral devices. Of course, this must be done while avoiding such problems as CHC effects and punchthrough.

Since each variation between implants received by the core and peripheral transistors requires the use of two separate masks, optimizing both sets of transistors requires 4–5 additional masks, and is not a cost-effective option. However, tests using identical implants for both the low voltage and high voltage devices, while preferable from a fabrication standpoint, do not provide high-voltage transistors which meet the necessary lifetime and performance specifications. The high MDD necessary for the core transistors causes the peripheral transistors to have too high an electrical field, even though the oxide thickness is increased for these transistors. In fact, a 50% reduction in Idrive was required in testing to obtain the desired CFC lifetime specification for this option.

Dual Voltage Process and Structure

The present invention provides a very simple and flexible approach to fabrication and structure of dual-voltage integrated circuits. The inventors have discovered that integration of a dual voltage process can be accomplished by modifying the MDD mask so that the high voltage NMOS device does not receive an MDD implant at all during the formation of the MDD of the low voltage NMOS device, while all other implants remain the same for core and peripheral transistors, thus eliminating the need for extra lithographic steps. The thickness of the sidewall spacer and the conditions of the source/drain implants, both of which are the same for core and peripheral transistors, are adjusted to keep the performance of the high voltage device within specification.

Advantages of the disclosed methods and structures include:

no additional lithographic steps necessary to integrate high-voltage transistors into flow for core transistors.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 shows a flowchart of the disclosed process.

FIG. 2 shows a cross-section of a low-voltage transistor (right side) and a high-voltage transistor from a chip in which the disclosed process is used.

DETAILES DESCRUPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

OVERVIEW

FIG. 1 shows the disclosed process as part of the fabrication process of an integrated circuit which includes both high-voltage and low-voltage transistors. This flow will now be disclosed in connection with a discussion of FIG. 2, which shows both a high-voltage and a low-voltage NMOS transistor. The formation of PMOS transistors is mentioned in the flow, but since PMOS transistors do not encounter the same level of difficulties with channel hot carriers, they generally already use the same implants for core and peripheral transistors. However, the same procedure described for NMOS transistors can be used for PMOS transistors, if desired.

The process begins with the formation of isolation structures (not shown) in substrate 10. These can be LOCOS oxidations, shallow trench isolation (STI), or other isolation schemes. A thin disposable oxide is generally grown to protect the silicon surface during implants. A photo-resist is deposited and patterned to cover the PMOS transistors and expose the NMOS transistor, then the channel implants such as the Vt implant, to adjust the turn-on voltage, and the Pt implant, to prevent punchthrough, are formed (step 110). After ashing the resist, a new photo-resist is deposited and patterned to expose only the PMOS transistors and their channel implants are formed (step 120).

Gate oxide 20 and gates 30 are formed (step 130), the oxide generally by oxidation and the gates generally by deposition and patterned etch of a layer of polysilicon, although, of course, this can be a layered structure, or use different materials. Generally, all gates will be a single layer of polysilicon, although differently doped layers may be used to form the PMOS and NMOS gates.

The PMOS transistors are then masked while drain extender implants 40 (e.g. LDD or MDD implants) are performed for the NMOS transistors (step 140), but in this disclosure, the mask is modified to also cover the higher-voltage (HV) transistors so that they do not receive the drain extender implant. This is followed by masking all the NMOS transistors while the PMOS transistors receive their drain extender implants (step 150).

Sidewall spacers 50 are then formed on all transistors (step 160), with preferably the same spacer being used for all transistors. This is followed by source/drain implants, first for the NMOS transistors (step 170), then for the PMOS transistors (step 180). With the lack of a drain extender implant on the high-voltage transistors, it is necessary to adjust both the gate sidewall spacers thickness and the source/drain implant conditions from the conditions optimized for the core transistors. The inventors anticipate that an angled implant with arsenic 60 and phosphorus 65 is needed to provide the gradation needed by the HV transistor. The angled implant must not overrun the MDD in the core transistors, but must have some overlap in HV. This is generally followed by formation of silicide contacts on the gate and on the source/drain areas (step 190). Fabrication then continues with deposition of a dielectric and metallization steps.

Finally, a silicide 70 is then formed (step 180), on the upper surface of the gate and on the source/drain areas, to provide contacts, and a dielectric layer 80 is deposited (step 190). Processing then continues with metallization (not shown) to provide the desired connections for the transistors.

FIRST EMBODIMENT

In the example shown here, the following conditions are used:

| | |
|---|---|
| Vt implant | boron: 4e12 @ 20 keV |
| Pt implant | boron: 6.5e12 @ 70 keV |
| MDD implant (LV only receives) | arsenic: 3e14 at 15 keV |

-continued

| | |
|---|---|
| Gate length: | 0.25 micron (LV) |
| | 0.41 micron (HV) |
| Gate oxide thickness | 6 nm (LV) |
| | 8 nm (HV) |

Since only the LV transistors receive an MDD implant, choosing the S/D implant conditions becomes critical for the HV device, as both its performance and reliability depend solely on these implants. On the other hand, the implants cannot be changed so drastically that they overrun the MDD of the LV device and alter its performance. The following source/drain implant conditions are predicted to provide LV and HV transistors which meet the specifications:
Arsenic 1.5e15@70 keV
Phosphorus: 5e14–9e14 @40–60 keV
Additionally, it is anticipated that the sidewall thickness used would be thinner than previously used, e.g. 80 nm.

According to a disclosed class of innovative embodiments, there is provided: An integrated circuit device structure, comprising: first and second pluralities of transistors of a first conductivity type, wherein all dopant diffusions of said first and second plurality of transistors are identical, except that said second plurality of transistors does not contain a diffusion which is self-aligned to the edges of a corresponding gate, while said first plurality of transistors does contain a diffusion which is self-aligned to the edges of a gate.

According to another disclosed class of innovative embodiments, there is provided: A fabrication method for an integrated circuit, comprising the step of forming first and second pluralities of transistors of a first conductivity type, said first and second pluralities of transistors having identical diffusions except that a diffusion which is self-aligned to the edges of a corresponding gate is formed for said first, but not said second, plurality of transistors.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit device structure, comprising:
    first low voltage and second relatively high voltage transistors of the same conductivity type disposed on a single semiconductor chip, each of said first and second transistors having a pair of source/drain regions separated by a channel region and a gate region over and spaced from said channel region,
    said source/drain regions of said first transistor composed of first and second implants, one of said first and second implants being self aligned to the edges of its corresponding gate region and extending under said gate region and the other of said first and second implants being aligned to a sidewall spacer on said corresponding gate region of said first transistor and extending beneath said first implant; and
    said source/drain regions of said second transistor composed of said second and a third implant, both of said implants of said second transistor being aligned to a sidewall spacer on said corresponding gate region of said second transistor.

2. The integrated circuit of claim 1, wherein said first and second transistors each have a gate oxide underlying the gate region of each of said first and second transistors, the gate oxide underlying said second transistor being thicker than the gate oxide underlying said first transistor.

3. The integrated circuit of claim 2, wherein said second transistor is connected to receive a higher voltage than said first transistor.

4. The integrated circuit of claim 3 wherein said first and second transistors are NMOS transistors.

5. The integrated circuit of claim 3 wherein said first and second transistors are PMOS transistors.

6. The integrated circuit of claim 2 wherein said first and second transistors are NMOS transistors.

7. The integrated circuit of claim 2 wherein said first and second transistors are PMOS transistors.

8. The integrated circuit of claim 1, wherein said second transistor is connected to receive higher voltages than said first transistor.

9. The integrated circuit of claim 8 wherein said first and second transistors are NMOS transistors.

10. The integrated circuit of claim 8 wherein said first and second transistors are PMOS transistors.

11. The integrated circuit of claim 1, wherein the second and third source/drain implants for said second transistor each contain a different one of arsenic and phosphorus.

12. The integrated circuit of claim 4 wherein said first and second transistors are NMOS transistors.

13. The integrated circuit of claim 1 wherein said first and second transistors are NMOS transistors.

14. The integrated circuit of claim 1 wherein said first and second transistors are PMOS transistors.

* * * * *